United States Patent
Choi (10) Patent No.: US 12,382,713 B2
(45) Date of Patent: Aug. 5, 2025

(54) SEMICONDUCTOR DEVICE, SEMICONDUCTOR DEVICE MANUFACTURING METHOD, AND DISPLAY DRIVING DEVICE COMPRISING SEMICONDUCTOR DEVICE

(71) Applicant: LX SEMICON CO., LTD., Daejeon (KR)

(72) Inventor: Kee Joon Choi, Daejeon (KR)

(73) Assignee: LX SEMICON CO., LTD., Daejeon (KR)

( * ) Notice: Subject to any disclaimer, the term of this patent is extended or adjusted under 35 U.S.C. 154(b) by 0 days.

(21) Appl. No.: 18/725,607

(22) PCT Filed: Dec. 27, 2022

(86) PCT No.: PCT/KR2022/021400
§ 371 (c)(1),
(2) Date: Jun. 28, 2024

(87) PCT Pub. No.: WO2023/128559
PCT Pub. Date: Jul. 6, 2023

(65) Prior Publication Data
US 2025/0133817 A1   Apr. 24, 2025

(30) Foreign Application Priority Data
Dec. 28, 2021   (KR) .................. 10-2021-0189391

(51) Int. Cl.
*H10D 84/83*   (2025.01)
*G09G 3/36*    (2006.01)
*H10D 84/01*   (2025.01)

(52) U.S. Cl.
CPC .......... *H10D 84/83* (2025.01); *G09G 3/3648* (2013.01); *H10D 84/013* (2025.01);
(Continued)

(58) Field of Classification Search
CPC .. H10D 84/83; H10D 84/013; H10D 84/0156; G09G 3/3648; G09G 2310/0286; G09G 2310/0289
See application file for complete search history.

(56) References Cited

U.S. PATENT DOCUMENTS 8,542,178 B2 * 9/2013 Yoo ..................... G09G 3/20
377/64
10,497,302 B2 * 12/2019 Peng ................... G09G 3/3677
(Continued)

FOREIGN PATENT DOCUMENTS

KR   10-2002-0084570 A   11/2002
KR      10-0800482 B1    2/2008
(Continued)

*Primary Examiner* — Vinh T Lam
(74) *Attorney, Agent, or Firm* — POLSINELLI PC (57) ABSTRACT

A semiconductor device includes a first device configured to receive a first level voltage through a first terminal, and output a first output voltage through a second terminal when a gate voltage is applied through a gate terminal; a boost device configured to receive a second level voltage through a first terminal, and output a second output voltage having a higher value than the first output voltage when the first output voltage is applied as a gate voltage through a gate terminal; and a second device configured to receive a third level voltage through a first terminal, and output a third output voltage when the second output voltage is applied as a gate voltage through a gate terminal, wherein the second output voltage is greater than a threshold voltage of the second device.

18 Claims, 6 Drawing Sheets

(52) U.S. Cl.
CPC . *H10D 84/0156* (2025.01); *G09G 2310/0286* (2013.01); *G09G 2310/0289* (2013.01)

(56) References Cited

U.S. PATENT DOCUMENTS

| | | | |
|---|---|---|---|
| 10,755,622 B2* | 8/2020 | Kong | G09G 3/2092 |
| 11,189,242 B2* | 11/2021 | Liao | G09G 3/3696 |
| 11,314,136 B2* | 4/2022 | Yamamoto | H10D 86/471 |
| 11,450,257 B2* | 9/2022 | Park | G11C 19/28 |
| 11,749,222 B2* | 9/2023 | Yamamoto | G09G 3/3674 |
| | | | 345/214 |
| 2005/0117406 A1 | 6/2005 | Atsumi et al. | |
| 2022/0068234 A1* | 3/2022 | Lin | G09G 3/3677 |
| 2022/0139349 A1* | 5/2022 | Park | G09G 3/3688 |
| | | | 345/87 |

FOREIGN PATENT DOCUMENTS

| | | |
|---|---|---|
| KR | 10-1532271 B1 | 6/2015 |
| KR | 10-1788459 B1 | 10/2017 |
| KR | 10-2021-0080869 A | 7/2021 |
| KR | 10-2394856 B1 | 5/2022 |

\* cited by examiner

SEMICONDUCTOR DEVICE, SEMICONDUCTOR DEVICE MANUFACTURING METHOD, AND DISPLAY DRIVING DEVICE COMPRISING SEMICONDUCTOR DEVICE

CROSS-REFERENCE TO RELATED APPLICATIONS

This application is a national phase entry of PCT International Application No. PCT/KR2022/021400 filed on Dec. 27, 2022, which claims the priority of Korean Patent Applications No. 10-2021-0189391 filed on Dec. 28, 2021, which are hereby incorporated by reference in their entirety.

BACKGROUND

Field of the Disclosure

The present specification relates to a semiconductor device, a method of manufacturing the semiconductor device, and a display driving apparatus including the semiconductor device.

Description of the Background

As the semiconductor industry has rapidly grown, generations of semiconductor devices in which each generation has smaller and more complicated circuits than the previous generation have been produced. In the process of integrated circuit (IC) evolution, a functional density (for example, the number of interconnected devices per chip area) has generally increased, but a geometric size (for example, the smallest component or line which can be generated using a manufacturing process) has been reduced. A process for reducing this geometric size has an advantage in that production efficiency can be increased and related costs can be lowered, but has a limitation in that complexity of processing and manufacturing semiconductor devices is increased.

SUMMARY

Accordingly, the present disclosure is directed to a semiconductor device, a method of manufacturing the semiconductor device and a display driving apparatus including the semiconductor device that substantially obviate one or more of problems due to limitations and disadvantages described above.

More specifically, the present disclosure is to provide a semiconductor device capable of stably driving a middle-voltage device even when a voltage output from a low-voltage device to the middle-voltage device is smaller than a threshold voltage of the middle-voltage device, a method of manufacturing the semiconductor device, and a display driving apparatus including the semiconductor device.

Further, the present disclosure is to provide a semiconductor device capable of reducing the manufacturing costs of a semiconductor device including a low-voltage device and a middle-voltage device, a method of manufacturing the semiconductor device, and a display driving apparatus including the semiconductor device.

Additional features and advantages of the disclosure will be set forth in the description which follows and in part will be apparent from the description, or may be learned by practice of the disclosure. Other advantages of the present disclosure will be realized and attained by the structure particularly pointed out in the written description and claims hereof as well as the appended drawings.

To achieve these and other advantages and in accordance with the present disclosure, as embodied and broadly described, a semiconductor device includes a first device configured to receive a first level voltage through a first terminal, and output a first output voltage through a second terminal when a gate voltage is applied through a gate terminal; a boost device configured to receive a second level voltage through a first terminal, and output a second output voltage having a higher value than the first output voltage when the first output voltage is applied as a gate voltage through a gate terminal; and a second device configured to receive a third level voltage through a first terminal, and output a third output voltage when the second output voltage is applied as a gate voltage through a gate terminal, wherein the second output voltage is a value greater than a threshold voltage of the second device.

In another aspect of the present disclosure, a method of manufacturing a semiconductor device includes forming a first well of a first device, a boost well of a boost device, and a second well of a second device in a substrate; forming a source-drain region of the first device, a source-drain region of the boost device, and a source-drain region of the second device in the substrate; and forming a gate structure of the first device, a gate structure of the boost device, and a gate structure of the second device on the substrate, wherein the first well is formed using a first well mask and a second well mask, the second well is formed using a third well mask and a fourth well mask, and the boost well is formed using the first and second well masks, or using the third and fourth well masks.

In a further aspect of the present disclosure, a display driving apparatus configured to receive image data and output the image data through a display panel, includes a latch circuit configured to sample and output the image data; and a level shifter circuit configured to boost and output a voltage level of the image data output from the latch circuit to a predetermined level, wherein the latch circuit includes a first device configured to receive a first level voltage through a first terminal, and output a first output voltage through a second terminal when a gate voltage is applied through a gate terminal, the level shifter circuit includes a boost device configured to receive a second level voltage through a first terminal, and output a second output voltage having a higher value than the first output voltage when the first output voltage is applied as a gate voltage through a gate terminal, and a second device configured to receive a third level voltage through a first terminal, and output a third output voltage when the second output voltage is applied as a gate voltage through a gate terminal, and the second output voltage is a value greater than a threshold voltage of the second device.

It is to be understood that both the foregoing general description and the following detailed description are exemplary and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of the present disclosure, illustrate aspects of the disclosure and together with the description serve to explain the principle of the disclosure.

In the drawings.

DETAILED DESCRIPTION

The same reference numerals refer to substantially the same components throughout the specification. In the following descriptions, detailed descriptions of configurations and functions known in the art of the present disclosure may be omitted when not related to fundamental configurations of the present disclosure. The meanings of terms described in the present specification should be understood as follows.

Advantages and features of the present disclosure, and a method of achieving them, will be apparent with reference to aspects which are described in detail in conjunction with the accompanying drawings. However, the present disclosure is not limited to the aspects which will be described below and may be implemented in different forms. The aspects are only provided to completely disclose the present disclosure and completely convey the scope of the present disclosure to those skilled in the art, and the present disclosure is only defined by the disclosed claims.

Since a shape, a size, a ratio, an angle, the number, and the like disclosed in the drawings for describing the aspect of the present disclosure are exemplary, the present disclosure is not limited to the shown items. The same reference numbers indicate the same components throughout the specification. Further, in descriptions of the present disclosure, when it is determined that detailed descriptions of related known technologies may obscure the principle of the present disclosure, the detailed descriptions thereof will be omitted.

When "include," "including," "have," "having," "formed of," or the like mentioned in the present specification is used, other components may be added unless 'only' is used. A case in which a component is expressed in a singular form includes a case of including a plural form unless explicitly stated otherwise.

In the interpretation of the components, it is interpreted that an error range is included even when there is no separate explicit description.

In the case of a description of a temporal relationship, for example, when a temporal precedence relationship is described in terms of 'after', 'followed by', 'next, 'before', and the like, non-continuous cases may also be included unless 'immediately' or 'directly' is used.

"First," "second," and the like are used to describe various components, but these components are not limited by these terms. These terms are used to only distinguish one component from another component. Accordingly, a first component to be mentioned below may also be a second component within the technical spirit of the present disclosure.

It should be understood that the term "at least one" includes all possible combinations from one or more related items. For example, the meaning of "at least one of the first, second, and third items" may refer to a combination of all items which may be proposed from two or more of the first item, the second item, and the third item, as well as each of the first item, the second item, or the third item.

Features of the various aspects of the present disclosure may be partially or entirely coupled or combined with each other, technically various interlocking and driving may be performed, and the aspects may be implemented independently of each other, or may be implemented together in an associated relationship.

Figure 1:
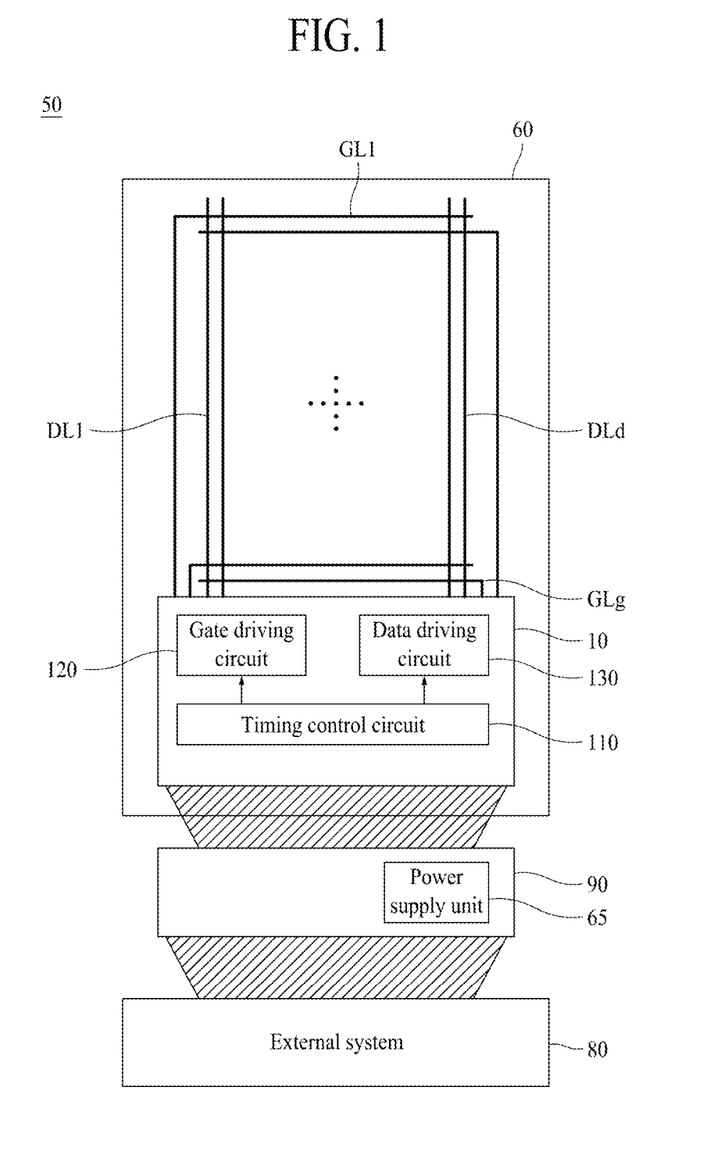
FIG. 1 is a view illustrating a display apparatus to which a display driving apparatus according to one aspect of the present disclosure is applied.

Hereinafter, a display apparatus including a display driving apparatus according to one aspect of the present disclosure will be described with reference to FIG. 1. FIG. 1 is a view illustrating a display apparatus to which a display driving apparatus according to one aspect of the present disclosure is applied;

A display apparatus (50) according to the present disclosure includes a display panel (60), a power supply unit (65), an external system (80), and a display driving apparatus (10).

The display panel (60) may be an organic light-emitting panel in which an organic light-emitting device is formed, and may also be a liquid crystal panel in which liquid crystal is formed. That is, all types of currently used panels may be applied as the display panel (60) applied to the present disclosure. Accordingly, the display apparatus according to the present disclosure may also be an organic light-emitting display apparatus, a liquid crystal display apparatus, and other various types of display apparatuses. However, for convenience of description, the liquid crystal display apparatus will be described below as an example of the present disclosure.

When the display panel (60) is a liquid crystal panel, a plurality of data lines (DL1 to DLd) and a plurality of gate lines (GL1 to GLg) which intersect the data lines (DL1 to DLd) are formed on a lower substrate of the display panel (60), and pixels are disposed in a matrix form by the intersecting structure of the data lines (DL1 to DLd) and the gate lines (GL1 to GLg). In the pixels, thin film transistors (TFTs) are formed at intersecting portions of the data lines (DL1 to DLd) and the gate lines (GL1 to GLg). Further, a plurality of pixel electrodes for charging a data voltage in the pixels and common electrodes for driving the liquid crystal filled in a liquid crystal layer together with the pixel electrodes are formed on the lower substrate.

A black matrix (BM) and a color filter are formed on an upper substrate of the display panel (60). The liquid crystal is filled between the lower substrate and the upper substrate.

A liquid crystal mode of the display panel (60) applied to the present disclosure may be any type of liquid crystal mode as well as a twisted nematic (TN) mode, a vertical alignment (VA) mode, an in-plane switching (IPS) mode, and a fringe-field switching (FFS) mode. Further, the display apparatus (50) according to the present disclosure may be implemented in any form such as a transmissive liquid crystal display apparatus, a transflective liquid crystal display apparatus, a reflective liquid crystal display apparatus, or the like.

The display panel (60) displays an image based on gate signals and source signals output from the display driving apparatus (10).

The power supply unit (65) is mounted on a main board (90) to supply a voltage for driving the display panel (60), the display driving apparatus (10), and the external system (80). In this case, various circuit devices in addition to the power supply unit (65) may be mounted on the main board (90).

The power supply unit (65) generates a voltage corresponding to a driving voltage of each of the circuits included in the display driving apparatus (10) and supplies the generated voltage to each circuit. In this case, the driving voltage of each of the circuits included in the display driving apparatus (10) may include a first level voltage, a second level voltage, and a third level voltage. The first level voltage refers to a low voltage, the second level voltage may be a voltage greater than the low voltage, and the third level voltage refers to a middle voltage. For example, the first level voltage may be 0.9 V to 1.1 V, the second level voltage may be 1.1 V to 1.3 V, and the third level voltage may be 7 V to 9 V.

Further, the power supply unit (65) supplies power for driving the display panel (60) to the display panel (60) so that the display panel (60) may operate.

The display driving apparatus (10) may include a gate driving circuit (120) for controlling signals input to the gate lines (GL1 to GLg), a data driving circuit (130) for controlling signals input to the data lines (DL1 to DLd), and a timing control circuit (110) for controlling the gate driving circuit (120) and the data driving circuit (130).

In this case, although FIG. 1 illustrates that the display driving apparatus (10) is mounted on the display panel (60), this is only one example, and the display driving apparatus (10) may also be separated from the display panel (60) and mounted through a separate board.

Further, the timing control circuit (110), the gate driving circuit (120), and the data driving circuit (130) constituting the display driving apparatus (10) may be configured as a single chip package as shown in FIG. 1, but may also be individually configured.

Figure 2:
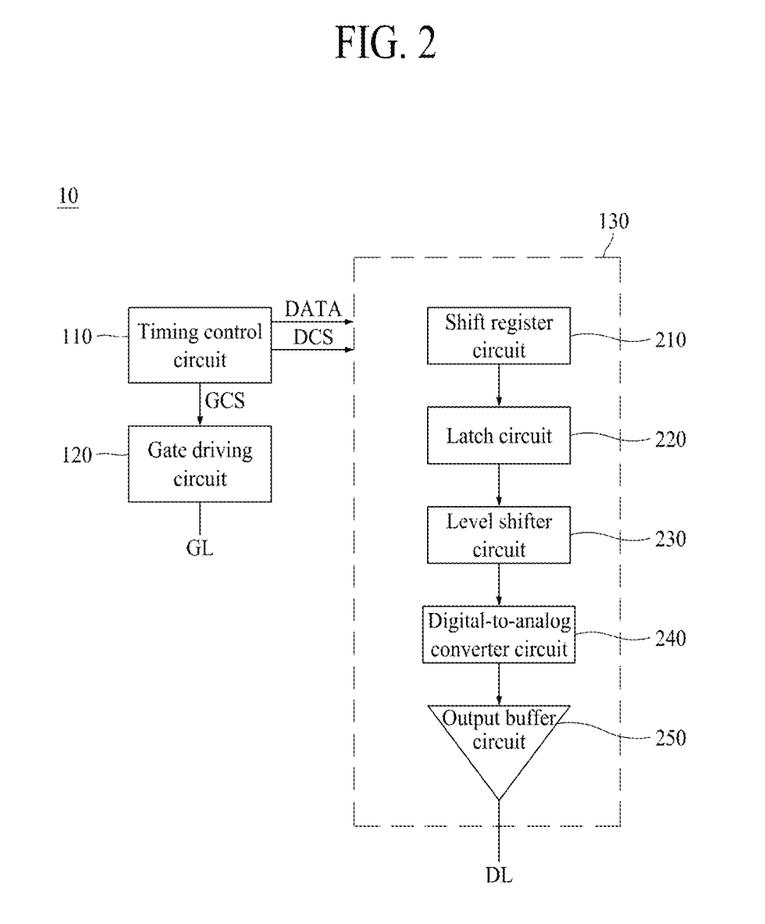
FIG. 2 is a view illustrating each circuit constituting the display driving apparatus according to one aspect of the present disclosure.

Hereinafter, the display driving apparatus according to the aspect of the present disclosure will be described in detail with reference to FIG. 2. FIG. 2 is a view illustrating each of the circuits constituting the display driving apparatus according to one aspect of the present disclosure.

As shown in FIG. 2, the timing control circuit (110) supplies a gate control signal (GCS) to the gate driving circuit (120) to control the gate driving circuit (120), and supplies a data control signal (DCS) to the data driving circuit (130) to control the data driving circuit (130). Specifically, the timing control circuit (110) receives first image data and timing signals from the external system (80). The timing control circuit (110) generates the gate control signal (GCS) for controlling the gate driving circuit (120) and the data control signal (DCS) for controlling the data driving circuit (130) according to the timing signals.

In one aspect, the gate control signal (GCS) may include a gate start pulse (GSP), a gate shift clock (GSC), a gate output enable signal (GOE), and the like, and the data control signal (DCS) may include a source start pulse (SSP), a source sampling clock (SSC), a source output enable signal (SOE), and the like.

The timing control circuit (110) transmits the gate control signal (GCS) to the gate driving circuit (120) and transmits the data control signal (DCS) to the data driving circuit (130).

The timing control circuit (110) arranges the first image data received from the external system (80). Specifically, the timing control circuit (110) generates second image data by arranging the first image data to match the structure and characteristics of the display panel (60). The timing control circuit (110) transmits the second image data to the data driving circuit (130).

The gate driving circuit (120) outputs the gate signals synchronized with the source signals generated by the data driving circuit (130) to the gate lines according to the timing signals generated by the timing control circuit (110). Specifically, the gate driving circuit (120) outputs the gate signals synchronized with the source signals to the gate lines according to the gate start pulse, the gate shift clock, and the gate output enable signal by the timing control circuit (110).

The gate driving circuit (120) includes a gate shift register circuit, a gate level shifter circuit, and the like. In this case, the gate shift register circuit may be directly formed on the lower substrate of the display panel (60) through a gate in panel (GIP) process. In this case, the gate driving circuit (120) supplies the gate start pulse and the gate shift clock signal to the gate shift register circuit formed on the lower substrate through the GIP process.

The data driving circuit (130) converts the second image data to the source signals according to the timing signals generated by the timing control circuit (110). Specifically, the data driving circuit (130) converts the second image data to the source signals according to the source start pulse, the source sampling clock, and the source output enable signal. The data driving circuit (130) outputs the source signals of one horizontal line to the data lines for each horizontal period in which the gate signals are supplied to the gate lines.

In this case, the data driving circuit (130) may receive a gamma voltage from a gamma voltage generation unit (not shown), and convert the second image data to the source signals using the gamma voltage. To this end, as shown in FIG. 2, the data driving circuit (130) includes a shift register circuit (210), a latch circuit (220), a level shifter circuit (230), a digital-to-analog converter circuit (240), and an output buffer circuit (250).

The shift register circuit (210) receives the source start pulses and the source sampling clocks from the timing control circuit (110), and sequentially shifts the source start pulses according to the source sampling clocks to output sampling signals. The shift register circuit (210) transmits the sampling signals to the latch circuit (220).

The latch circuit (220) sequentially samples and latches the second image data by predetermined units according to the sampling signals. The latch circuit (220) transmits the latched second image data to the level shifter circuit (230).

The level shifter circuit (230) amplifies a level of the latched second image data. Specifically, the level shifter circuit (230) amplifies the level of the second image data to a level at which the digital-to-analog converter circuit (240) may be driven. The level shifter circuit (230) transmits the second image data, of which the level is amplified, to the digital-to-analog converter circuit (240).

The digital-to-analog converter circuit (240) converts the second image data to source signals which are analog signals. The digital-to-analog converter circuit (240) transmits the source signals to the output buffer circuit (250).

The output buffer circuit (250) outputs the source signals to the data lines. Specifically, the output buffer circuit (250) buffers the source signals according to the source output enable signals generated by the timing control circuit (110) and outputs the source signals to the data lines.

According to one aspect of the present disclosure, the shift register circuit (210) and the latch circuit (220) receive the first level voltage which is the above-described low voltage as the driving voltage, and the level shifter circuit (230)

receives the third level voltage which is the above-described middle voltage as the driving voltage. In other words, since the shift register circuit (210) and the latch circuit (220) include a low-voltage device (LV Device) which receives a first level voltage (LV VDD) which is a low voltage as the driving voltage, and the level shifter circuit (230) includes a middle-voltage device (MV Device) which receives a third level voltage (MV VDD) which is a middle voltage as the driving voltage, the display driving apparatus (10) according to one aspect of the present disclosure may include a semiconductor device including the low-voltage device (LV Device) and the middle-voltage device (MV Device).

When geometric sizes of the low-voltage device (LV Device) and the middle-voltage device (MV Device) decrease, a problem in that characteristics of the low-voltage device (LV Device) and the middle-voltage device (MV Device) vary may occur. For example, when the geometric sizes of the low-voltage device (LV Device) and the middle-voltage device (MV Device) decrease, since an output voltage (LV_Out) output to a gate terminal of the middle-voltage device (MV Device) from the low-voltage device (LV Device) decreases, and a threshold voltage (Vth_MV) of the middle-voltage device (MV Device) increases, a problem in that the middle-voltage device (MV Device) does not operate may occur.

To prevent this, according to one aspect of the present disclosure, the level shifter circuit (230) of the display driving apparatus (10) additionally includes a boost device (Boost Device) which boosts the output voltage (LV_Out) output from the low-voltage device (LV Device).

When the output voltage (LV_Out) of the low-voltage device (LV Device) is input, the boost device (Boost Device) boosts the output voltage (LV_Out) and supplies the boosted output voltage (LV_Out) to the gate terminal of the middle-voltage device (MV Device), and thus the middle-voltage device (MV Device) may stably operate even when the output voltage (LV_Out) of the low-voltage device (LV Device) decreases below the threshold voltage of the middle-voltage device (MV Device) due to a decrease in the geometric sizes of the low-voltage device (LV Device) and the middle-voltage device (MV Device).

Specifically, to ensure stable operation of the middle-voltage device (MV Device), the boost device (Boost Device) may boost the output voltage (LV_Out) output from the low-voltage device (LV Device) to the threshold voltage (Vth_MV) or higher of the middle-voltage device (MV Device) and supply the output voltage (LV_Out) to the middle-voltage device (MV Device).

Hereinafter, the semiconductor device according to one aspect of the present disclosure will be described with reference to FIGS. 3 and 4.

Figure 3:
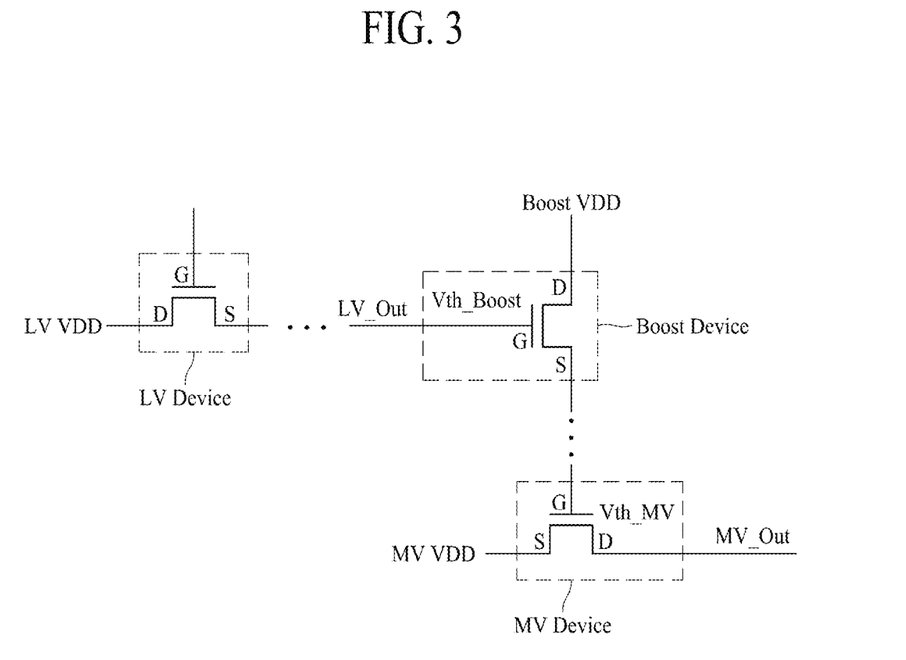
FIG. 3 is a partial circuit diagram of a semiconductor device according to one aspect of the present disclosure.

FIG. 3 is a partial circuit diagram of the semiconductor device according to one aspect of the present disclosure.

Referring to FIG. 3, the semiconductor device according to one aspect of the present disclosure includes the low-voltage device (LV Device), the boost device (Boost Device), and the middle-voltage device (MV Device).

The low-voltage device (LV Device) receives a first level voltage (LV VDD) through a first terminal (D) and outputs a first output voltage (LV_Out) through a third terminal(S) according to a gate voltage applied to a second terminal (G). In this case, according to one aspect of the present disclosure, the first output voltage (LV_Out) of the low-voltage device (LV Device) may be a value smaller than or equal to the threshold voltage (Vth_MV) of the middle-voltage device (MV Device), and greater than or equal to a threshold voltage (Vth_Boost) of the boost device (Boost Device). For example, the first output voltage (LV_Out) may be a value smaller than or equal to 0.9 V.

The boost device (Boost Device) receives a second level voltage (Boost VDD) through a first terminal (D), and outputs the second level voltage (Boost VDD) through a third terminal(S) according to the first output voltage of the low-voltage device (LV Device) applied to a second terminal (G) as a gate voltage. In this case, the second level voltage (Boost VDD) may be a value greater than the first level voltage (LV VDD) and smaller than the third level voltage (MV VDD).

According to one aspect of the present disclosure, the second level voltage (Boost VDD) and a second output voltage (Boost_Out) are values greater than the first level voltage (LV VDD), the first output voltage (LV_Out), and the threshold voltage (Vth_MV) of the middle-voltage device (MV Device), and smaller than the third level voltage (MV_VDD).

For example, the second level voltage (Boost VDD) and the second output voltage (Boost_Out) may be values from 1.1 V to 1.3 V, the threshold voltage (Vth_MV) of the middle-voltage device (MV Device) may be a value smaller than or equal to 1.0 V, and the third level voltage (MV VDD) may be a value from 7 V to 9 V. Further, the threshold voltage (Vth_Boost) of the boost device (Boost Device) may be a value smaller than the first output voltage (LV_Out). Accordingly, since the boost device (Boost Device) supplies the second output voltage (Boost_Out) having a value greater than the first output voltage (LV_Out) and the threshold voltage (Vth_MV) of the middle-voltage device (MV Device) to a first terminal (G) of the middle-voltage device (MV Device) as the gate voltage, the middle-voltage device (MV Device) may be stably driven even when the first output voltage (LV_Out) of the low-voltage device (LV Device) has a value smaller than the threshold voltage (Vth_MV) of the middle-voltage device (MV Device).

The middle-voltage device (MV Device) receives the third level voltage (MV VDD) through a second terminal(S) and outputs the third output voltage (MV_Out) through a third terminal (D) according to the second output voltage (Boost_Out) of the boost device (Boost Device) input to the first terminal (G) as the gate voltage. In this case, the third output voltage (MV_Out) may have a value greater than the first output voltage (LV_Out) and the second output voltage (MV_Out). For example, the third output voltage (MV_Out) may have a value from 7 V to 9 V. Meanwhile, the third level voltage (MV VDD) may have a value greater than the first level voltage (LV VDD) and the second level voltage (Boost VDD).

Hereinafter, a structure of the semiconductor device according to one aspect of the present disclosure will be described with reference to FIG. 4. FIG. 4 is a cross-sectional view of the semiconductor device according to one aspect of the present disclosure.

Figure 4:
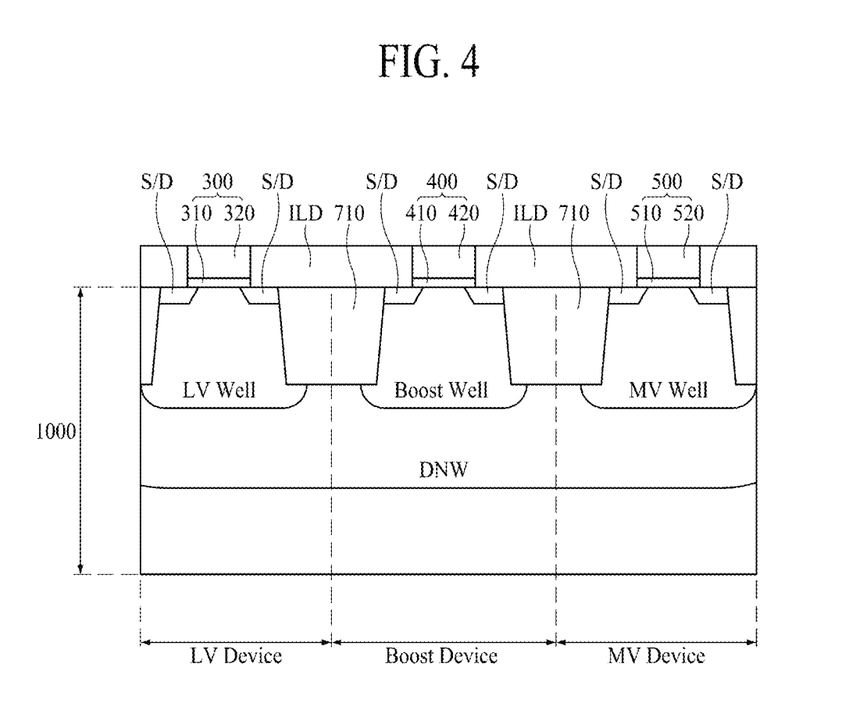
FIG. 4 is a cross-sectional view of the semiconductor device according to one aspect of the present disclosure.

As shown in FIG. 4, the low-voltage device (LV Device), the boost device (Boost Device), and the middle-voltage device (MV Device) according to the present disclosure may be stacked in a substrate (1000) or on the substrate (1000).

The substrate (1000) may include an element (single element) semiconductor, a compound semiconductor, or an alloy semiconductor. In one aspect, the element (single element) semiconductor may be composed of silicon, germanium, and/or other suitable materials, the compound semiconductor may be composed of silicon carbide, gallium arsenic, gallium phosphide, indium phosphide, indium arsenic, indium antimonide, and/or other suitable materials, and the alloy semiconductor may be composed of SiGe, GaAsP, AlInAs, AlGaAs, GaInAs, GaInP, GaInAsP, and/or other suitable materials.

The substrate (1000) may be formed of a single layer material having a uniform composition. Alternatively, the substrate (1000) may include multiple material layers having similar or different compositions suitable for manufacturing an integrated circuit (IC) device. For example, the substrate (1000) may be a silicon-on-insulator (SOI) having a silicon layer formed on a silicon oxide layer. Alternatively, the substrate (1000) may include a conductive layer, a semiconductor layer, a dielectric layer, other layers, or combinations thereof.

The substrate (1000) includes various doped regions located in the substrate (1000) or on the substrate (1000). The doped regions may be doped with n-type dopants such as phosphorus or arsenic, and/or p-type dopants such as boron or BF2 according to a design requirement. Further, the doped regions may be formed directly on the substrate (1000), in a p-well structure, in an n-well structure, in a dual-well structure, or in a raised structure. The doped regions may be formed by implantation of dopant atoms, in-situ doped epitaxial growth, and/or other suitable technologies.

For example, the substrate (1000) may include a deep n-well (DNW), a low-voltage well (LV well), a middle-voltage well (MV well), and a boost well (Boost well). The deep n-well (DNW) is a region located in a region corresponding to the low-voltage device (LV Device) and the middle-voltage device (MV Device) and doped with an n-type dopant. The low-voltage well (LV well) and the middle-voltage well (MV well) are regions doped with an n-type dopant or a p-type dopant in the deep n-well (DNW).

The substrate (1000) includes isolation structures (710) located in the substrate (1000) to electrically isolate devices. To this end, each of the isolation structures (710) may be located between two devices.

For example, as shown in FIG. 4, the isolation structure (710) may be located between the low-voltage device (LV Device) and the boost device (Boost Device) to electrically separate the low-voltage device (LV Device) and the boost device (Boost Device) from each other. Further, the isolation structure (710) may be located between the boost device (Boost Device) and the middle-voltage device (MV Device) to electrically separate the boost device (Boost Device) and the middle-voltage device (MV Device) from each other. In addition, although not shown in the drawing, the isolation structure (710) may also be located between the low-voltage device (LV Device) and the middle-voltage device (MV Device) to electrically separate the low-voltage device (LV Device) and the middle-voltage device (MV Device) from each other.

The isolation structure (710) may include a shallow trench isolation (STI) structure.

The isolation structure (710) may include a dielectric material different from the substrate (1000). For example, the isolation structure (710) may be silicon dioxide, silicon nitride, silicon carbide, silicon oxycarbide, silicon oxynitride, another suitable dielectric material, or an arbitrary combination thereof, or may be composed of a dielectric including the same.

An interlayer dielectric layer (ILD) is located on the substrate (1000). For example, the interlayer dielectric layer (ILD) may be or include silicon dioxide, a low-k dielectric material, an extremely low-k dielectric material, another suitable dielectric material, or an arbitrary combination thereof. However, the present disclosure is not limited thereto, and the interlayer dielectric layer (ILD) may have a structure in which a plurality of layers are stacked, and each layer may be composed of a material having a different permittivity.

The low-voltage device (LV Device), the boost device (Boost Device), and the middle-voltage device (MV Device) respectively include wells (the LV well, the Boost well, and the MV well) located in the substrate 1000. Specifically, the low-voltage device (LV Device) includes a low-voltage well (LV well)) the boost device (Boost Device) includes the boost well (Boost well), and the middle-voltage device (MV Device) includes the middle-voltage well (MV well). As described above, the low-voltage well (LV well), the boost well (Boost well), and the middle-voltage well (MV well) may be regions doped with an n-type dopant or a p-type dopant.

Each of the low-voltage device (LV Device), the boost device (Boost Device), and the middle-voltage device (MV Device) includes a source-drain region (S/D) located in the substrate (1000). Each of the source-drain regions (S/D) may be located adjacent to the isolation structure (710), and may be located with gate structures (300, 400, and 500) interposed therebetween on a plane.

At least a portion of the substrate (1000) may be doped with a first doping type, and the source-drain region (S/D) may be doped with a second doping type and formed in a region of the substrate (1000) doped with the first doping type. In this case, the source-drain region (S/D) may include highly doped regions. For example, the first doping type may be a p-type and the second doping type may be an n-type, or vice versa.

The low-voltage device (LV Device), the boost device (Boost Device), and the middle-voltage device (MV Device) include gate structures (300, 400, and 500) located on the substrate (1000), respectively. The gate structures (300, 400, and 500) are located between the source-drain regions (S/D) of the low-voltage device (LV Device) and the middle-voltage device (MV Device). The gate structures (300, 400, and 500) may include gate dielectric layers (310, 410, and 510) and gate electrodes (320, 420, and 520), respectively.

The gate dielectric layers (310, 410, 510) may be or include an oxide (for example, silicon oxide), a nitride (for example, silicon nitride), a high-k dielectric material, or the like. When the gate dielectric layers (310, 410, and 510) are stacked through a high-k metal gate process (HKMG), the gate dielectric layers (310, 410, and 510) may include high-k dielectric materials. For example, each of the gate dielectric layers (310, 410, 510) may include a dielectric material composed of hafnium oxide, lanthanum oxide, other suitable materials, or a combination thereof. Further, each of the gate dielectric layers (310, 410, and 510) may have a structure in which a plurality of layers are stacked, and each layer may be composed of a material having a different permittivity.

The gate electrodes (320, 420, and 520) are stacked on the gate dielectric layers (310, 410, and 510), respectively. Each of the gate electrodes (320, 420, 520) may be or include, for example, titanium nitride, tantalum nitride, titanium, tantalum, tungsten, aluminum, copper, another suitable conductive metal material, or an arbitrary combination thereof. Alternatively, each of the gate electrodes (320, 420, 520) may be or include polysilicon, intrinsic polysilicon, doped polysilicon, or an arbitrary combination thereof. Further, each of the gate electrodes (320, 420, and 520) may have a structure in which a plurality of layers are stacked, and each layer may be composed of a different conductive metal material.

Further, although not shown, each of the gate structures (300, 400, and 500) may further include a diffusion barrier layer or a work function layer. The diffusion barrier layer may be formed of titanium nitride (TiN), which may be doped (or undoped) with silicon. The work function layer may determine a work function of each gate, and may include at least one layer or a plurality of layers formed of different materials.

Although FIG. 4 illustrates that the low-voltage device (LV Device), the boost device (Boost Device), and the middle-voltage device (MV Device) respectively include the gate structures (300, 400, and 500) stacked through a gate last process, the present disclosure is not limited thereto, and the low-voltage device (LV Device), the boost device (Boost Device), and the middle-voltage device (MV Device) may respectively include gate structures stacked through a gate first process.

As another example, some of the low-voltage device (LV Device), the boost device (Boost Device), and the middle-voltage device (MV Device) may include the gate structure stacked through the gate last process, and the other(s) may include the gate structures stacked through the gate first process.

Further, although not shown in the drawings, each of the low-voltage device (LV Device), the boost device (Boost Device), and the middle-voltage device (MV Device) may include a contact structure for electrical circuit connection with another device. The contact structures may be located in the interlayer dielectric layer (ILD) on the substrate (1000), and may come into direct contact with the gate structures (300, 400, and 500) or the source-drain regions (S/D) of the low-voltage device (LV Device), the boost device (Boost Device), and the middle-voltage device (MV Device) to be electrically connected thereto. This contact structure may include one or more of copper, aluminum, tungsten, and the like.

Hereinafter, a method of manufacturing the semiconductor device according to one aspect of the present disclosure will be described with reference to FIGS. 5 to 6D.

Figure 5:
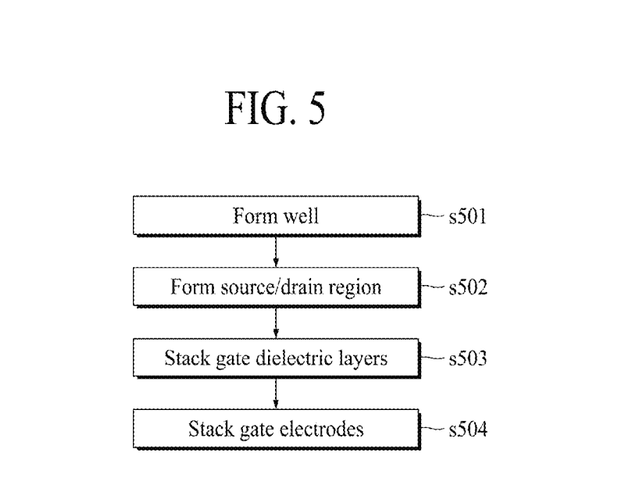
FIG. 5 is a flow chart of a manufacturing process of the semiconductor device according to one aspect of the present disclosure.

FIG. 5 is a flow chart of a manufacturing process of the semiconductor device according to one aspect of the present disclosure, and FIGS. 6A to 6D are views illustrating the manufacturing process of the semiconductor device according to one aspect of the present disclosure.

Figure 6A:
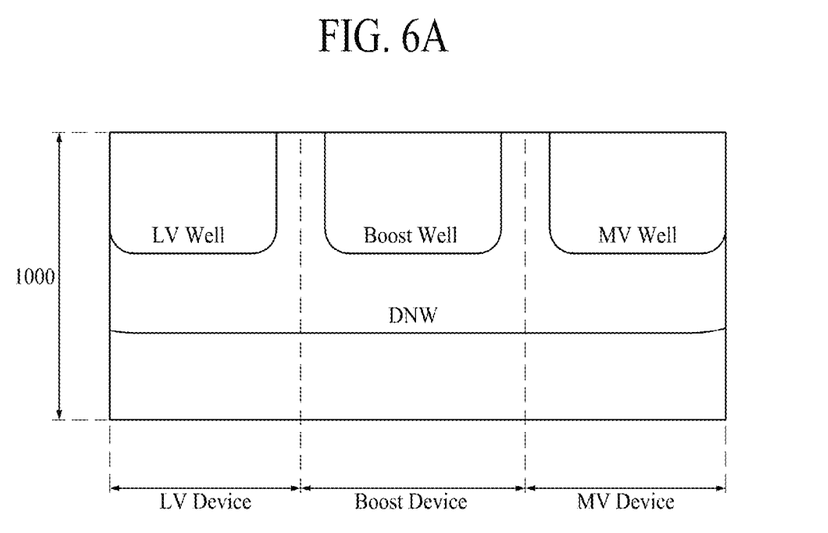
FIGS. 6A to 6D are views illustrating the manufacturing process of the semiconductor device according to one aspect of the present disclosure.

Referring to FIG. 5, first, a deep n-well (DNW) is formed in a substrate (1000), and then wells are formed in regions corresponding to a low-voltage device (LV Device), a boost device (Boost Device), and a middle-voltage device (MV Device) in the deep n-well (DNW) (s501). Specifically, as shown in FIG. 6A, the substrate (1000) is doped with an n-type dopant to form the deep n-well (DNW) in the substrate (1000), and a low-voltage well (LV well) and a middle-voltage well (MV well) doped with an n-type dopant or a p-type dopant are formed in the regions corresponding to the low-voltage device (LV Device) and the boost device (Boost Device) in the deep n-well (DNW).

In this case, although not shown in the drawing, the low-voltage well (LV well) of the low-voltage device (LV Device) and the middle-voltage well (MV well) of the middle-voltage device (MV Device) may be formed through ion implantation processes using masks. In one aspect, the low-voltage well (LV well) of the low-voltage device (LV Device) and the middle-voltage well (MV well) of the middle-voltage device (MV Device) may be formed through ion implantation processes using different masks. For example, the low-voltage well (LV well) of the low-voltage device (LV Device) may be formed through an ion implantation process using first and second well masks for each doping type, and the middle-voltage well (MV well) of the middle-voltage device (MV Device) may be formed through an ion implantation process using third and fourth well masks for each doping type.

According to one aspect of the present disclosure, the boost well (Boost well) of the boost device (Boost Device) may be formed through an ion implantation process using the first and second well masks or the third and fourth well masks. That is, according to one aspect of the present disclosure, the low-voltage well (LV well) and the boost well (Boost well) may be formed using the first and second well masks, or the boost well (Boost well) and the middle-voltage well (MV well) may be formed using the third and fourth well masks. Accordingly, the low-voltage well (LV well) and the boost well (Boost well) may be composed of the same material, or the boost well Boost well and the middle-voltage well (MV well) may be composed of the same material. Specifically, the low-voltage well (LV well) and the boost well (Boost well) may be doped with the same doping type and may have substantially the same concentration. Alternatively, the boost well (Boost well) and the middle-voltage well (MV well) may be doped with the same doping type and may have substantially the same concentration.

According to one aspect of the present disclosure, since the boost well (Boost well) of the boost device (Boost Device) is formed using well masks for forming the low-voltage well (LV well) and the middle-voltage well (MV well), and thus a separate mask is not required, manufacturing costs of the semiconductor device may be reduced.

Figure 6B:
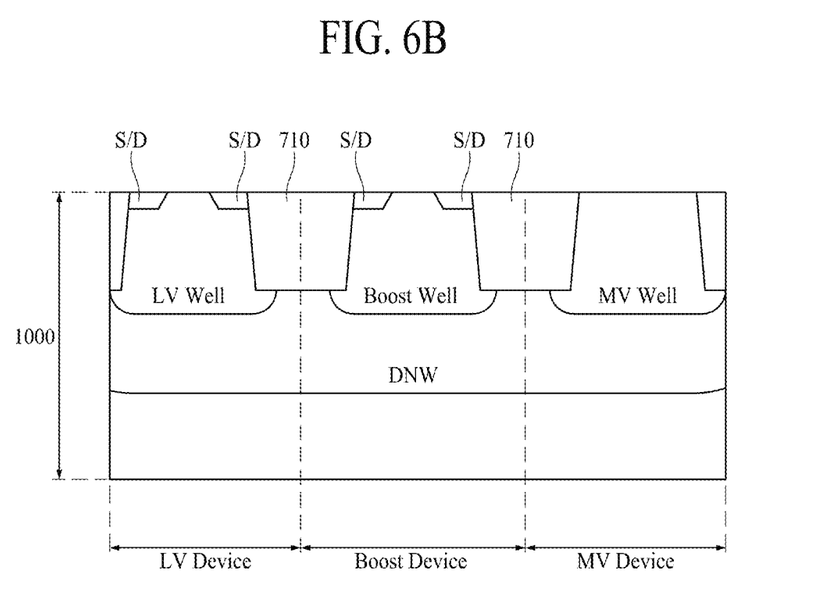

Thereafter, source-drain regions (S/D) are formed in the regions of the substrate (1000) corresponding to the low-voltage device (LV Device), the boost device (Boost Device), and the middle-voltage device (MV Device) (s502). Specifically, as shown in FIG. 6B, the source-drain regions (S/D) are formed by doping the regions corresponding to the low-voltage device (LV Device) and the boost device (Boost Device) of the substrate 1000 an n-type dopant or a p-type dopant. In this case, although not shown in the drawing, the source-drain region (S/D) of the low-voltage device (LV Device) and the source-drain region (S/D) of the middle-voltage device (MV Device) may be formed through ion implantation processes using masks.

In one aspect, the source-drain region (S/D) of the low-voltage device (LV Device) and the source-drain region (S/D) of the middle-voltage device (MV Device) may be formed through ion implantation processes using different masks. For example, as shown in FIG. 6B, the source-drain region (S/D) of the low-voltage device (LV Device) may be formed through an ion implantation process using first and second source-drain masks for each doping type, and as shown in FIG. 6C, the middle-voltage well (MV well) of the middle-voltage device (MV Device) may be formed through an ion implantation process using third and fourth S/D masks for each doping type.

According to one aspect of the present disclosure, the source-drain region (S/D) of the boost device (Boost Device) may be formed through the ion implantation process using the first and second source-drain masks for each doping type. That is, according to one aspect of the present disclosure, the source-drain region (S/D) of the low-voltage device (LV Device) and the source-drain region (S/D) of the boost device (Boost Device) may be formed using the first and second source-drain masks, and the source-drain region (S/D) of the middle-voltage device (MV Device) may be formed using the third and fourth source-drain masks.

Accordingly, the source-drain region (S/D) of the low-voltage device (LV Device) and the source-drain region (S/D) of the boost device (Boost Device) may be composed of the same material. For example, the source-drain region (S/D) of the low-voltage device (LV Device) and the source-drain region (S/D) of the boost device (Boost Device) may be doped with the same doping type and may have substantially the same concentration.

Figure 6C:
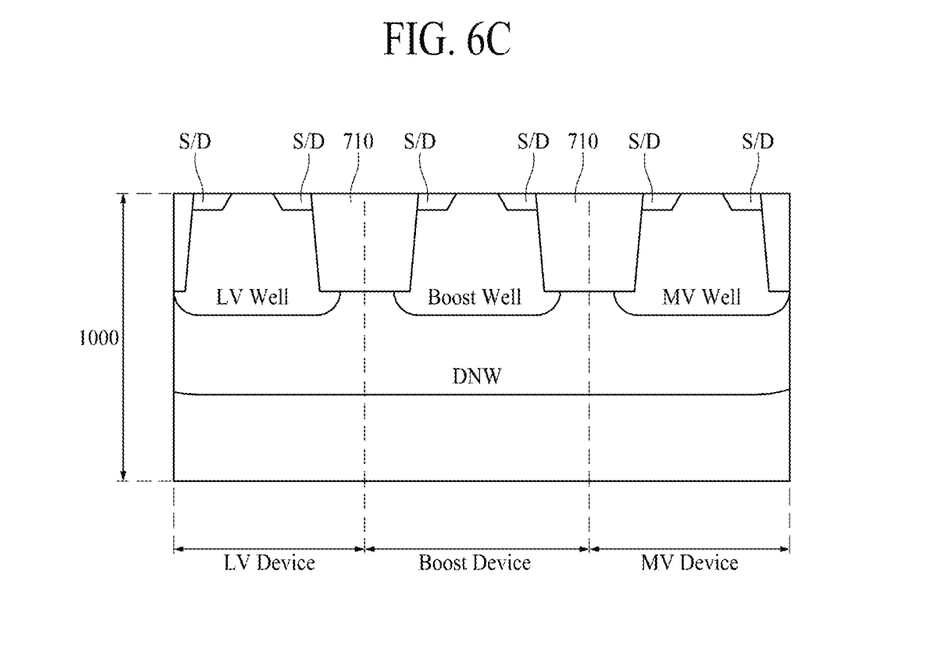

FIGS. 6B and 6C illustrate that the source-drain region (S/D) of the middle-voltage device (MV Device) is formed after the source-drain region (S/D) of the low-voltage device (LV Device) and the source-drain region (S/D) of the boost device (Boost Device) are formed, but the aspect of the present disclosure is not limited thereto, and the source-drain region (S/D) of the low-voltage device (LV Device) and the source-drain region (S/D) of the boost device (Boost Device) may be formed after the source-drain region (S/D) of the middle-voltage device (MV Device) is formed.

Further, to electrically isolate the devices, isolation structures (710) may be formed in the substrate (1000). For example, as shown in FIGS. 6B and 6C, the isolation structure (710) may be located between the low-voltage device (LV Device) and the boost device (Boost Device) to electrically separate the low-voltage device (LV Device) and the boost device (Boost Device) from each other. Further, the isolation structure (710) may be located between the middle-voltage device (MV Device) and the boost device (Boost Device) to electrically separate the boost device (Boost Device) and the middle-voltage device (MV Device) from each other. In addition, although not shown in the drawing, the isolation structure (710) may be located between the low-voltage device (LV Device) and the middle-voltage device (MV Device) to electrically separate the low-voltage device (LV Device) and the middle-voltage device (MV Device) from each other.

According to one aspect of the present disclosure, since the source-drain region (S/D) of the boost device (Boost Device) may be formed using the first source-drain mask and the second source-drain mask for forming the source-drain region (S/D) of the low-voltage device (LV Device), and thus a separate mask for forming the source-drain region (S/D) of the boost device (Boost Device) is not required, manufacturing costs of the semiconductor device may be reduced.

Figure 6D:
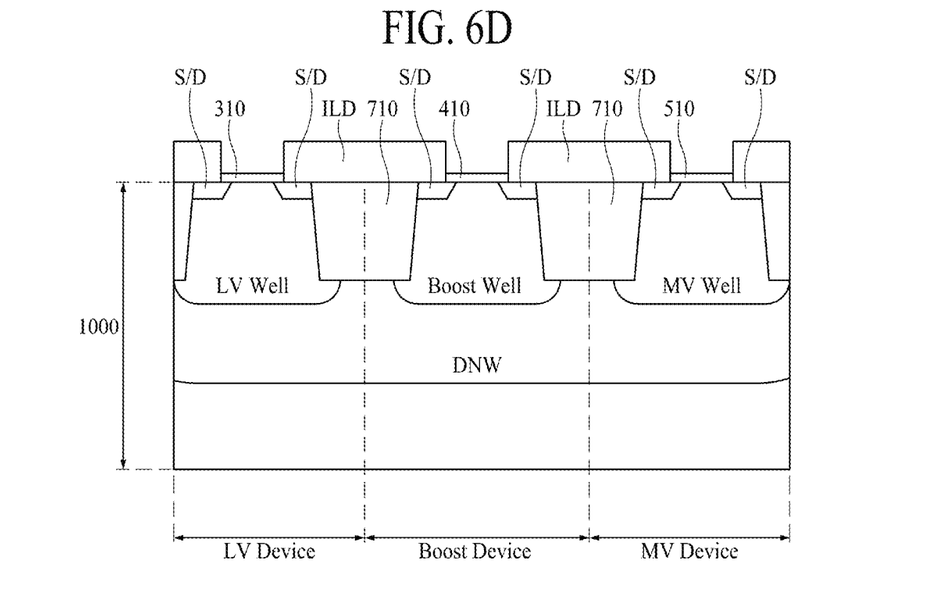

Thereafter, as shown in FIG. 6D, gate dielectric layers (310, 410, and 510) are respectively stacked on regions of the substrate (1000) corresponding to the low-voltage device (LV Device), the boost device (Boost Device), and the middle-voltage device (MV Device) (s503). In one aspect, the gate dielectric layers (310, 410, and 510) may be respectively formed on the regions of the substrate (1000) corresponding to the low-voltage device (LV Device), the boost device (Boost Device), and the middle-voltage device (MV Device) using different masks. That is, the gate dielectric layer (310) of the low-voltage device (LV Device) may be formed using a first dielectric mask, the gate dielectric layer (410) of the boost device (Boost Device) may be formed using a second dielectric mask, and the gate dielectric layer (510) of the middle-voltage device (MV Device) may be formed using a third dielectric mask. In this case, the gate dielectric layers (310, 410, and 510) may be formed by patterning after gate dielectric layer materials are applied, but the aspect of the present disclosure is not limited thereto, and the gate dielectric layers (310, 410, and 510) may be formed through an oxidation process.

Further, as shown in FIG. 6D, an interlayer dielectric layer (ILD) may be formed on the regions of the substrate (1000) corresponding to the low-voltage device (LV Device), the boost device (Boost Device), and the middle-voltage device (MV Device) before or after the gate dielectric layers (310, 410, and 510) are formed. However, the aspect of the present disclosure is not limited thereto.

Thereafter, as the gate electrodes (320, 420, and 520) are respectively stacked on the regions of the substrate (1000) corresponding to the low-voltage device (LV Device), the boost device (Boost Device), and the middle-voltage device (MV Device) (s504), a semiconductor device having the structure as shown in FIG. 4 is formed. Thereafter, although not shown in the drawing, upper surfaces of the interlayer dielectric layer (ILD) and the gate electrodes (320, 420, and 520) may be planarized through a chemical mechanical planarization process.

Although FIGS. 5 to 6D illustrate that the low-voltage device (LV Device), the boost device (Boost Device), and the middle-voltage device (MV Device) respectively include the gate structures (300, 400, and 500) stacked through the gate last process, the present disclosure is not limited thereto, and the low-voltage device (LV Device), the boost device (Boost Device), and the middle-voltage device (MV Device) may respectively include the gate structures stacked through the gate first process, and alternatively, some of the low-voltage device (LV Device), the boost device (Boost Device), and the middle-voltage device (MV Device) may include the gate structure stacked through the gate last process, and the other(s) may include the gate structures stacked through the gate first process.

According to one aspect of the present disclosure, since the boost device (Boost Device) outputs the second output voltage (Boost_Out) of a value greater than the first output voltage (LV_Out) of the low-voltage device (LV Device) and the threshold voltage (Vth_MV) of the middle-voltage device (MV Device) to the gate terminal of the middle-voltage device (MV Device), the middle-voltage device (MV Device) may be driven even when the first output voltage (LV_Out) of the low-voltage device (LV Device) has a value smaller than the threshold voltage (Vth_MV) of the middle-voltage device (MV Device).

Further, according to one aspect of the present disclosure, since the boost well (Boost well) of the boost device (Boost Device) may be formed using the well masks for forming the low-voltage well (LV well) or the middle-voltage well (MV well), and the source-drain region (S/D) of the boost device (Boost Device) may be formed using the first source-drain mask and the second source-drain mask for forming the source-drain region (S/D) of the low-voltage device (LV Device), and thus an additional mask is not required, manufacturing costs of the semiconductor device may be reduced.

According to the present disclosure, since a semiconductor device further includes a boost device which boosts an output voltage output from a low-voltage device to a value greater than a threshold voltage of a middle-voltage device and applies the output voltage to a gate terminal of the middle-voltage device, there is an effect in that the middle-voltage device can be stably driven even when the output voltage of the low-voltage device is smaller than the threshold voltage of the middle-voltage device.

Further, according to the present disclosure, since a well of the boost device can be formed using a well mask for forming a well of the low-voltage device or a well of the middle-voltage device, and thus a separate mask for forming the well of the boost device is not required, there is an effect in that manufacturing costs of the semiconductor device can be reduced.

In addition, according to the present disclosure, since a source-drain region of the boost device can be formed using a mask for forming a source-drain region of the low-voltage device, and thus a separate mask for forming the source-drain region of the boost device is not required, there is an effect in that manufacturing costs of the semiconductor device can be reduced.

Those skilled in the art may understand that the present disclosure may be embodied in other specific forms without changing the technical spirit or essential features thereof.

Accordingly, the above-described aspects should be understood as being exemplary and not limiting. Further, the scope of the present disclosure will be shown by the appended claims rather than the above-described detailed description, and all possible changes or modifications in forms derived from the meaning and the scope of the claims and equivalents thereof should be understood as being within the scope of the present disclosure.

What is claimed is:

1. A semiconductor device comprising:
a first device configured to receive a first level voltage through a first terminal, and output a first output voltage through a second terminal when a gate voltage is applied through a gate terminal;
a boost device configured to receive a second level voltage through a first terminal, and output a second output voltage having a higher value than the first output voltage when the first output voltage is applied as a gate voltage through a gate terminal; and
a second device configured to receive a third level voltage through a first terminal, and output a third output voltage when the second output voltage is applied as a gate voltage through a gate terminal,
wherein the second output voltage is greater than a threshold voltage of the second device.

2. The semiconductor device of claim 1, wherein the second level voltage is greater than the first level voltage and smaller than the third level voltage.

3. The semiconductor device of claim 1, wherein the first output voltage is greater than a threshold voltage of the boost device.

4. The semiconductor device of claim 1, wherein
each of the first device, the boost device, and the second device includes a well located in a substrate; and
wherein the well of the boost device is composed of the same material as any one of the well of the first device and the well of the second device.

5. The semiconductor device of claim 4, wherein the well of the boost device is doped with a same doping type and has a same doping concentration as the well of the first device, or doped with a same doping type and has a same doping concentration as the well of the second device.

6. The semiconductor device of claim 1, wherein
each of the first device, the boost device, and the second device includes a source-drain region located in a substrate, and
wherein the source-drain region of the boost device includes a same material as the source-drain region of the first device.

7. The semiconductor device of claim 6, wherein the source-drain region of the boost device is doped with a same doping type and has a same doping concentration as the source-drain region of the first device.

8. The semiconductor device of claim 1, further comprising:
a first isolation structure disposed between the first device and the boost device in a substrate to isolate the first device and the boost device; and
a second isolation structure disposed between the boost device and the second device in the substrate to isolate the boost device and the second device.

9. A method of manufacturing a semiconductor device, comprising:
forming a first well of a first device, a boost well of a boost device, and a second well of a second device in a substrate;
forming a source-drain region of the first device, a source-drain region of the boost device, and a source-drain region of the second device in the substrate; and
forming a gate structure of the first device, a gate structure of the boost device, and a gate structure of the second device on the substrate,
wherein the first well is formed using a first well mask and a second well mask,
the second well is formed using a third well mask and a fourth well mask, and
the boost well is formed using the first and second well masks, or using the third and fourth well masks.

10. The method of manufacturing of claim 9, wherein
the source-drain region of the first device is formed using a first source/drain (S/D) mask and a second S/D mask;
the source-drain region of the second device is formed using a third S/D mask and a fourth S/D mask; and
the source-drain region of the boost device is formed using the first and second S/D masks or the third and fourth S/D masks.

11. A display driving apparatus configured to receive image data and output the image data through a display panel, the display driving apparatus comprising:
a latch circuit configured to sample and output the image data; and
a level shifter circuit configured to boost and output a voltage level of the image data output from the latch circuit to a predetermined level,
wherein the latch circuit includes a first device configured to receive a first level voltage through a first terminal, and output a first output voltage through a second terminal when a gate voltage is applied through a gate terminal,
wherein the level shifter circuit includes a boost device configured to receive a second level voltage through a first terminal, and output a second output voltage having a higher value than the first output voltage when the first output voltage is applied as a gate voltage through a gate terminal, and a second device configured to receive a third level voltage through a first terminal, and output a third output voltage when the second output voltage is applied as a gate voltage through a gate terminal, and
wherein the second output voltage is a value greater than a threshold voltage of the second device.

12. The display driving apparatus of claim 11, further comprising a shift register circuit configured to generate a sampling signal for sampling the image data and output the sampling signal to the latch circuit,
wherein the shift register circuit includes the first device.

13. The display driving apparatus of claim 11, wherein the second level voltage is greater than the first level voltage and smaller than the third level voltage.

14. The display driving apparatus of claim 11, wherein the first output voltage is greater than a threshold voltage of the boost device.

15. The display driving apparatus of claim 11, wherein
- each of the first device, the boost device, and the second device includes a well located in a substrate, and
- wherein the well of the boost device includes a same material as one of the well of the first device and the well of the second device.

16. The display driving apparatus of claim 15, wherein the well of the boost device is doped with a same doping type and has a same doping concentration as the well of the first device, or is doped with a same doping type and has a same doping concentration as the well of the second device.

17. The display driving apparatus of claim 11, wherein
- each of the first device, the boost device, and the second device includes a source-drain region located in a substrate, and
- wherein the source-drain region of the boost device is composed of the same material as the source-drain region of the first device.

18. The display driving apparatus of claim 17, further comprising:
- a first isolation structure disposed between the first device and the boost device in the substrate to isolate the first device and the boost device; and
- a second isolation structure for disposed between the boost device and the second device in the substrate to isolate the boost device and the second device.

* * * * *